(12) United States Patent
Komada (10) Patent No.: US 7,700,384 B2
(45) Date of Patent: Apr. 20, 2010

(54) NITRIDE SEMICONDUCTOR LIGHT EMITTING DEVICE AND MANUFACTURING METHOD THEREOF

(75) Inventor: Satoshi Komada, Mihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/706,266

(22) Filed: Feb. 15, 2007

(65) Prior Publication Data

US 2007/0194328 A1 Aug. 23, 2007

(30) Foreign Application Priority Data

Feb. 20, 2006 (JP) ............................. 2006-042632

(51) Int. Cl.
*H01L 21/00* (2006.01)
(52) U.S. Cl. .......................................... 438/20; 438/48
(58) Field of Classification Search ............. 438/20–48, 438/E33.008, E33.28
See application file for complete search history.

(56) References Cited

U.S. PATENT DOCUMENTS

| 4,844,719 | A | 7/1989 | Toyomoto et al. |
| 5,990,496 | A | 11/1999 | Kunisato et al. |
| 6,071,351 | A | 6/2000 | Venkatasubramanian |
| 6,084,899 | A | 7/2000 | Shakuda |
| 6,150,677 | A * | 11/2000 | Tanaka et al. ............... 257/201 |
| 6,162,656 | A | 12/2000 | Kunisato et al. |
| 6,258,619 | B1 | 7/2001 | Sonobe et al. |
| 6,337,493 | B1 * | 1/2002 | Tanizawa et al. ............... 257/79 |
| 6,369,506 | B1 | 4/2002 | Hata |
| 6,580,099 | B2 | 6/2003 | Nakamura et al. |
| 7,042,019 | B1 | 5/2006 | Wu et al. |
| 7,095,042 | B2 | 8/2006 | Kim et al. |
| 2003/0127658 | A1 | 7/2003 | Sheu et al. |
| 2004/0056259 | A1 | 3/2004 | Goto et al. |

(Continued)

FOREIGN PATENT DOCUMENTS

CN 1540775 A 10/2004

(Continued)

OTHER PUBLICATIONS

U.S. Office Action mailed Sep. 29, 2009, directed to related U.S. Appl. No. 11/707,058; 10 pages.

(Continued)

*Primary Examiner*—Cuong Q Nguyen
(74) *Attorney, Agent, or Firm*—Morrison & Foerster LLP (57) ABSTRACT

An object is to provide a nitride semiconductor light emitting device capable of attaining high light emission output while lowering Vf, as well as to provide a manufacturing method thereof. The invention relates to a nitride semiconductor light emitting device, including at least an n-type nitride semiconductor, a p-type nitride semiconductor and an active layer formed between said n-type nitride semiconductor and said p-type nitride semiconductor, wherein the n-type nitride semiconductor includes a multi-layered nitride semiconductor layer having at least twice repeated stacked structure consisting of a first nitride semiconductor layer and a second nitride semiconductor layer, the multi-layered nitride semiconductor layer is formed in contact with the active layer, the first nitride semiconductor layer is a layer containing an n-type impurity, and the second nitride semiconductor layer is an undoped layer or a layer containing said n-type impurity to a concentration lower than said first nitride semiconductor layer.

7 Claims, 3 Drawing Sheets

U.S. PATENT DOCUMENTS

| | | |
|---|---|---|
| 2004/0159848 A1 | 8/2004 | Yamaguchi et al. |
| 2004/0222499 A1 | 11/2004 | Shibata et al. |
| 2006/0054917 A1 | 3/2006 | Lee et al. |
| 2006/0234411 A1 | 10/2006 | Ryu et al. |
| 2007/0200126 A1 | 8/2007 | Komada et al. |
| 2007/0202621 A1 | 8/2007 | Komada |
| 2008/0131988 A1 | 6/2008 | Lee et al. |

FOREIGN PATENT DOCUMENTS

| | | |
|---|---|---|
| EP | 1 063 711 | 12/2000 |
| JP | 11-330554 | 11/1999 |
| JP | 2000-232236 A | 8/2000 |
| JP | 2000-244072 | 9/2000 |
| JP | 2001-119066 A | 4/2001 |
| JP | 2001-196702 | 7/2001 |

OTHER PUBLICATIONS

Komada, S. et al., U.S. Office Action, mailed Apr. 16, 2009, directed towards related U.S. Appl. No. 11/706,267; 18 pages.

U.S. Office Action mailed on Dec. 23, 2008 directed towards related U.S. Appl. No. 11/706,267; 21 pages.

Office Action mailed Sep. 26, 2008 directed to U.S. Appl. No. 11/706,267; 19 pages.

* cited by examiner

NITRIDE SEMICONDUCTOR LIGHT EMITTING DEVICE AND MANUFACTURING METHOD THEREOF

This nonprovisional application is based on Japanese Patent Application No. 2006-042632 filed with the Japan Patent Office on Feb. 20, 2006, the entire contents of which are hereby incorporated by reference.

BACKGROUND OF THE INVENTION

1. Field of the Invention

The present invention relates to a nitride semiconductor light emitting device suitably applied to a light emitting device such as a light emitting diode (LED) or a laser diode (LD), as well as to a method of manufacturing the same.

2. Description of the Background Art

When a light emitting diode (LED) is used as an illuminating light source or a backlight for a display, it is necessary that the device has high light emitting efficiency and low forward voltage (hereinafter denoted as Vf). Japanese Patent Laying-Open No. 2000-244072 proposes a technique for improving light emission output of an LED, by forming an n-side first multi-layered film layer having at least two pairs of two different types of nitride semiconductor layers, that is, a nitride semiconductor layer doped with an n-type impurity and an undoped nitride semiconductor layer not doped with the n-type impurity. Further, Japanese Patent Laying-Open No. 2000-244072 describes that Vf is lowered by providing an n-side second multi-layered film layer, formed by stacking a first nitride semiconductor layer containing In and a second nitride semiconductor layer having a composition different from the first nitride semiconductor layer, between the n-side first multi-layered film layer and an active layer.

It is noted, however, that the n-type contact layer is formed by selecting at least one of the method involving increased carrier density and a method involving smaller band gap, in order to decrease contact resistance to lower Vf. Therefore, the layer tends to contain much dislocation and defects. When the n-side first multi-layered film layer is stacked in contact with the n-type contact layer, it would undesirably be influenced by the dislocation or defects, and sufficient effect of improving light emission output would not be attained. Further, in Japanese Patent Laying-Open No. 2000-244072, the second multi-layered film layer is stacked to the side of the active layer than the n-side first multi-layered film layer. When two different types of multi-layered films are grown, manufacturing process becomes complicated and the manufacturing cost increases. In addition, stacking of a nitride semiconductor layer containing In on the n-side of the active layer induces dislocation and defects of In, which affects crystallinity of the active layer and possibly causes decrease in light emission output.

SUMMARY OF THE INVENTION

The present invention was made to solve the above-described problems, and its object is to provide a nitride semiconductor light emitting device having low forward voltage (Vf) and capable of exhibiting high light emission output, as well as to provide a method of manufacturing the same.

The present invention is directed to a nitride semiconductor light emitting device, including: at least an n-type nitride semiconductor, a p-type nitride semiconductor and an active layer formed between the n-type nitride semiconductor and the p-type nitride semiconductor; wherein the n-type nitride semiconductor includes a multi-layered nitride semiconductor layer having a stacked structure consisting of a first nitride semiconductor layer and a second nitride semiconductor layer repeated at least twice; the multi-layered nitride semiconductor layer is formed in contact with the active layer; and the first nitride semiconductor layer is a layer containing an n-type impurity, and the second nitride semiconductor layer is an undoped layer or a layer containing the n-type impurity to a concentration lower than the first nitride semiconductor layer.

In the present invention, preferably, the multi-layered nitride semiconductor layer consists of GaN layers.

In the present invention, preferably, n-type impurity concentration of the first nitride semiconductor layer is higher than $1\times10^{18}/cm^3$; and n-type impurity concentration of the second nitride semiconductor layer is not higher than $1\times10^{18}/cm^3$.

In the present invention, preferably, thickness of each of the first nitride semiconductor layer and the second nitride semiconductor layer is at most 100 nm.

The present invention also relates to a method of manufacturing any of the nitride semiconductor light emitting devices described above, including the steps of forming the n-type nitride semiconductor including the multi-layered nitride semiconductor layer, forming the active layer, and forming the p-type nitride semiconductor layer, in a stacked manner; wherein the multi-layered nitride semiconductor layer is grown by organic metal vapor deposition in a carrier gas containing nitrogen at a growth temperature of 500 to 1000° C.

According to the present invention, a nitride semiconductor light emitting device having low forward voltage (Vf) and exhibiting high light emission output can be obtained.

The nitride semiconductor light emitting device in accordance with the present invention is suitably applicable to light emitting devices such as light emitting diodes (LEDs) and laser diodes (LDs).

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, embodiments of the present invention will be described with reference to the figures. The present invention, however, is not limited to the embodiments. Though an embodiment in which the nitride semiconductor light emitting device of the present invention implemented as an LED will be described in the following, the nitride semiconductor light emitting device in accordance with the present invention is also applicable to a semiconductor laser and the like.

The nitride semiconductor light emitting device in accordance with the present invention includes at least an n-type nitride semiconductor, a p-type nitride semiconductor layer, and an active layer formed between the n-type nitride semiconductor layer and the p-type nitride semiconductor layer; the n-type nitride semiconductor layer includes a multi-layered nitride semiconductor layer having a stacked structure of a first nitride semiconductor layer and a second nitride semiconductor layer repeated at least twice; the multi-layered nitride semiconductor layer is formed in contact with the active layer; the first nitride semiconductor layer is a layer containing an n-type impurity; and the second nitride semiconductor layer is a layer containing the n-type impurity to a concentration lower than in the first nitride semiconductor layer or an undoped layer. Specifically, in the nitride semiconductor light emitting device in accordance with the present invention, the multi-layered nitride semiconductor layer, in which layers of relatively high concentration of n-type impurity and layers of relatively low concentration of the n-type impurity or layers not containing the n-type impurity are stacked one after another, is formed in contact with the active layer. Consequently, the light emission output of the nitride semiconductor light emitting device can be improved while maintaining low Vf. Though details of the mechanism how the light emission output improves are not clear, one possible reason may be improved efficiency of carriers introduced to the active layer.

Figure 4:
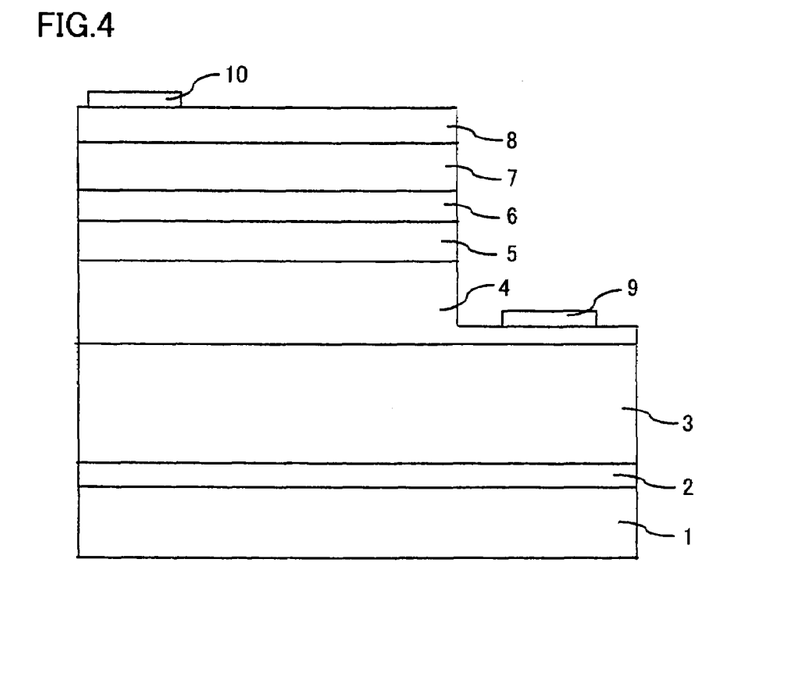
FIG. 4 illustrates a common nitride semiconductor light emitting device.

Referring to FIG. 4, on a substrate 1, a buffer layer 2, an underlying n-type GaN layer 3, an n-type contact layer 4, an active layer 5, a p-type clad layer 6, a p-type contact layer 7, a transparent electrode 8, an n-side pad electrode 9, and a p-side pad electrode 10 are formed. In contrast, referring to FIG. 1, on substrate 1, buffer layer 2, underlying n-type GaN layer 3, n-type contact layer 4, a multi-layered nitride semiconductor layer 101, active layer 5, p-type clad layer 6, p-type contact layer 7, transparent electrode 8, n-side pad electrode 9 and p-side pad electrode 10 are formed. In the structure shown in FIG. 1, underlying n-type GaN layer 3, n-type contact layer 4 and multi-layered nitride semiconductor layer 101 form the n-type nitride semiconductor of the present invention, while p-type clad layer 6 and p-type contact layer 7 form the p-type nitride semiconductor of the present invention, and between the n-type nitride semiconductor and the p-type nitride semiconductor, active layer 5 is formed.

The nitride semiconductor light emitting device in accordance with the present invention may be manufactured by a method including the steps of forming the n-type nitride semiconductor containing multi-layered nitride semiconductor layers, forming an active layer and forming the p-type nitride semiconductor, in a stacked manner. Typical structure and manufacturing method of the nitride semiconductor light emitting device in accordance with the present invention will be described with reference to the structure shown in FIG. 1 as an example, though the present invention is not limited thereto.

<Substrate 1>

Figure 1:
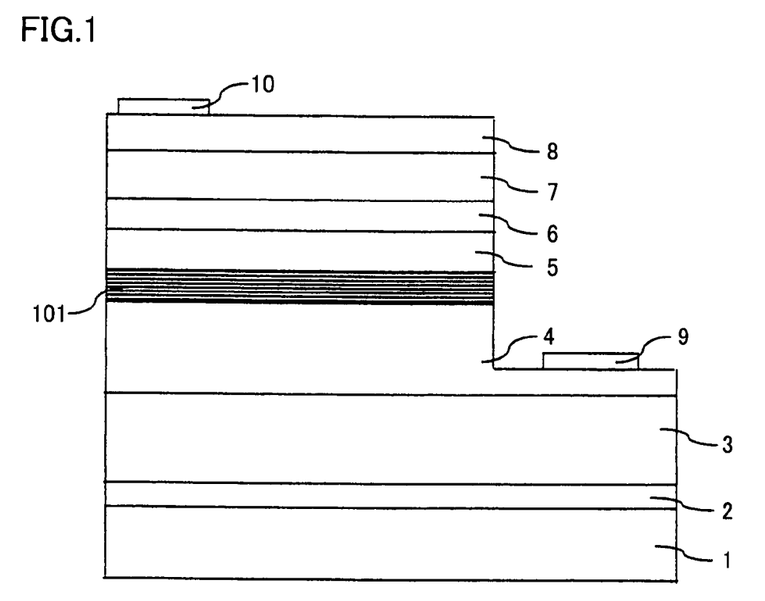
FIG. 1 shows an exemplary structure of the nitride semiconductor light emitting device in accordance with the present invention.

As substrate 1, sapphire (C plane), for example, may be used. In the present invention, preferably, substrate 1 is set in a reaction furnace of an MOCVD apparatus, and growth temperature is increased, for example, to 1050° C. while causing flow of hydrogen, so that substrate 1 is cleaned in advance.

<Buffer Layer 2>

On substrate 1, buffer layer 2 is formed. Specifically, growth temperature is decreased, for example, to 510° C., and using hydrogen as a carrier gas and ammonia and TMG (trimethyl gallium) as raw material gases, buffer layer 2, for example, of GaN is grown to the thickness of about 200 A on substrate 1.

<N-Type Nitride Semiconductor>

(Underlying n-Type GaN Layer 3)

On buffer layer 2, underlying n-type GaN layer 3 is formed. Specifically, the growth temperature is increased to 1050° C., and using hydrogen as the carrier gas, ammonia and TMG as the raw material gases and silane as an impurity gas, underlying n-type GaN layer 3 of GaN doped with Si to the concentration of $1\times10^{18}/cm^3$ is grown to the thickness of about 6 μm.

(N-Type Contact Layer 4)

On underlying n-type GaN layer 3, n-type contact layer 4 is formed. Specifically, n-type contact layer 4 of GaN doped with Si to the concentration of $5\times10^{18}/cm^3$ is grown to the thickness of about 0.5 μm under the conditions similar to those of underlying n-type GaN layer 3.

(Multi-Layered Nitride Semiconductor Layer 101)

On n-type contact layer 4, multi-layered nitride semiconductor layer 101 is formed, typically by organic metal vapor deposition. It is preferred that multi-layered nitride semiconductor layer 101 formed in the present invention is of binary mixed crystal of GaN layer, since high crystallinity and better effect of improving light emission output can be attained. The first nitride semiconductor layer and the second nitride semiconductor layer forming multi-layered nitride semiconductor layer 101 may be formed in the following manner. Using ammonia and TMG as the raw material gas and silane as the impurity gas, the first nitride semiconductor layer of GaN layer doped with Si to the concentration x of $1\times10^{18}<x\leq1\times10^{21}/cm^3$, typically the concentration of $x=1\times10^{19}/cm^3$, is grown, and on the GaN layer, the second nitride semiconductor layer is grown. The second nitride semiconductor layer of the present invention is formed as an undoped layer or a layer having lower concentration of n-type impurity than the first nitride semiconductor layer. When the second nitride semiconductor layer is formed as an undoped layer, an undoped GaN layer is grown to the thickness of about 20 nm on the first nitride semiconductor layer, using hydrogen as the carrier gas and ammonia and TMG as the raw material gases at a growth temperature of 1050° C. When the second nitride semiconductor layer is formed as an n-type layer having lower impurity concentration than the first nitride semiconductor layer, using hydrogen as the carrier gas, ammonia and TMG as raw material gases and silane as the impurity gas, at a growth temperature of 1050° C., a GaN layer doped with Si to the concentration x of $1\times10^{18}<x\leq1\times10^{21}/cm^3$, typically the concentration of $x=1\times10^{19}/cm^3$, is grown to the thickness of about 20 nm on the first nitride semiconductor layer. This realizes higher effect of improving light emission output. In the present invention, it is preferred that a nitrogen-containing gas is used as the carrier gas of the multi-layered nitride semiconductor layer and that the growth temperature is in the range of 500 to 1000° C., since superior effects of improving the light emission output and lowering Vf can be attained. Though details as to why Vf decreases when a nitrogen-containing gas is used as the carrier gas of the multi-layered nitride semiconductor layer and the growth temperature is in the range of 500 to 1000° C. are not clear, possible reason is that contact resistance between the active layer and the multi-layered nitride semiconductor layer decreases. Preferable range of growth temperature is 750 to 900° C. As for the conditions of carrier gas, when the carrier gas is a mixed gas of nitrogen and hydrogen, flow ratio of nitrogen in the mixed gas should preferably be at least 50% by volume, and the carrier gas of nitrogen only is the most preferable.

In the present invention, it is preferred that the first nitride semiconductor layer has n-type impurity concentration higher than $1\times10^{18}/cm^3$ and the second nitride semiconductor layer has n-type impurity concentration not higher than $1\times10^{18}/cm^3$. When the n-type impurity concentrations of the first and second nitride semiconductor layers are set in the ranges described above, good effect of improving light emission output can be attained. N-type impurity concentration of the first nitride semiconductor layer of $5\times10^{18}/cm^3$ or higher is more preferable.

In the present invention, it is preferred that the first and second nitride semiconductor layers each have the thickness of at most 100 nm. Then, good effect of improving light emission output can be attained. More preferably, the first and second nitride semiconductor layers each have the thickness of at most 20 nm. From the viewpoint of attaining good effect of improving light emission output, the effect of improving light emission output by the present invention can sufficiently be attained when the thickness is about 20 nm. In order to sufficiently vary the n-type impurity concentration between the first and second nitride semiconductor layers, the second nitride semiconductor layer preferably has the thickness sufficient to prevent the n-type impurity from being diffused from the first nitride semiconductor layer to the entire second nitride semiconductor layer, specifically, thickness of at least 2 nm. The first nitride semiconductor layer preferably has the thickness of at least 1 nm.

In the present invention, the stacked structure consisting of the first and second nitride semiconductor layers is repeated at least twice, and this attains the effect of improving light emission output. Preferable period of repetition of the stacked structure is at least 5. When the period of repetition is around 5, the effect of improving light emission output of the present invention can satisfactorily be ensured. In the present invention, repetition period of at most 20 is preferred, as excessive increase in manufacturing cost resulting from complicated manufacturing process of the nitride semiconductor light emitting device can be avoided.

Though an example in which the first and second nitride semiconductor layers are stacked in this order on the contact layer has been described, the order of stacking the first and second nitride semiconductor layers of the present invention is not limited to that described above. What is necessary is that the multi-layered nitride semiconductor layer consisting of the stacked structure of the first and second nitride semiconductor layers is formed in contact with the active layer.

<Active Layer 5>

On multi-layered nitride semiconductor layer 101, active layer 5 is formed. Specifically, using nitrogen as the carrier gas and ammonia, TMG and TMI as raw material gases with the growth temperature lowered, for example, to 700° C., $In_{0.25}Ga_{0.75}N$ and GaN having the thickness of about 2.5 nm and about 18 nm, respectively, are grown alternately for 6 periods, whereby active layer 5 having a multiquantum well structure may be formed.

<P-Type Nitride Semiconductor>

(P-Type Clad Layer 6)

On active layer 5, p-type clad layer 6 is formed. Specifically, using hydrogen as the carrier gas, ammonia, TMA and TMG raw material gases, and CP2Mg (cyclopentadienyl magnesium) as the impurity gas with the growth temperature increased, for example, to 950° C., p-type clad layer 6 of $Al_{0.15}Ga_{0.85}N$ doped with Mg to a concentration of, for example, $5\times10^{19}/cm^3$ is grown to the thickness of about 30 nm.

(P-Type Contact Layer 7)

On p-type clad layer 6, p-type contact layer 7 is formed. Specifically, using hydrogen as the carrier gas, ammonia and TMG as the raw material gases, and CP2Mg as the impurity gas with the growth temperature kept, for example, at 950° C., p-type contact layer 7 of GaN doped with Mg to a concentration of, for example, $1\times10^{20}/cm^3$ is grown to the thickness of about 0.1 μm.

<Annealing>

Next, annealing is performed using nitrogen as the carrier gas with the growth temperature lowered, for example, to 700° C. Through the method described above, a wafer having, formed on substrate 1, buffer layer 2, underlying n-type GaN layer 3, n-type contact layer 4, multi-layered nitride semiconductor layer 101, active layer 5, p-type clad layer 6 and p-type contact layer 7, is obtained.

<Electrode Formation>

The wafer obtained by the above-described method is taken out from the reaction furnace, a mask patterned to a prescribed shape is formed on a surface of the uppermost layer, that is, p-type contact layer 7, and etching is done from the side of p-type contact layer 7 by an RIE (Reactive Ion Etching) apparatus, so that the surface of n-type contact layer 4 is exposed. After etching, almost on the entire surface of the uppermost, p-type contact layer 7, transparent electrode 8 containing Pd is formed to the thickness of about 7 nm, and at a prescribed position thereon, p-side pad electrode 10 of Au is formed to the thickness of about 0.5 μm, respectively. On the surface of n-type contact layer 4 exposed by etching, n-side pad electrode 9 containing Ti and Al is formed. In this manner, the LED as the nitride semiconductor light emitting device in accordance with the present invention can be obtained.

<N-Type Nitride Semiconductor Layer>

Figure 2:
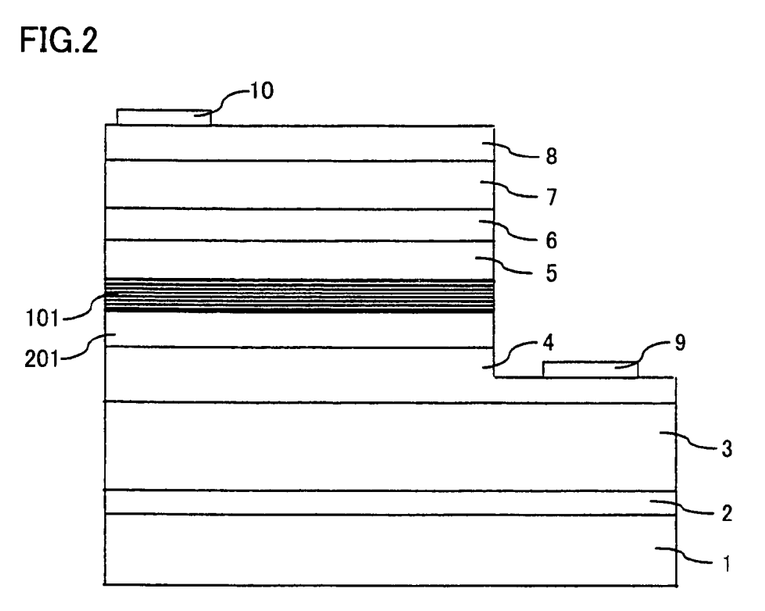
FIGS. 2 and 3 show other exemplary structures of the nitride semiconductor light emitting device in accordance with the present invention.

In the present invention, it is more preferred to form multi-layered nitride semiconductor layer 101 apart from the n-type contact layer, and when the n-type nitride semiconductor layer is grown with the n-type impurity concentration x in the range of $5\times10^{17} \leq x \leq 1\times10^{18}/cm^3$, the effect of improving light emission output of multi-layered nitride semiconductor layer can further be improved without increasing Vf. One possible method of forming the multi-layered nitride semiconductor layer apart form the contact layer is to form an n-type nitride semiconductor layer 201 of, for example, GaN, between n-type contact layer 4 and multi-layered nitride semiconductor layer 101. In this case also, multi-layered nitride semiconductor layer 101 is formed in contact with active layer 5.

For n-type nitride semiconductor layer 201, hydrogen was used as the carrier gas, ammonia and TMG were used as the raw material gas, and silane was used as the impurity gas. By way of example, assume that a GaN layer doped with Si to a concentration of $5\times10^{18}/cm^3$ is used as n-type contact layer 4, multi-layered nitride semiconductor layer 101 is formed on n-type nitride semiconductor layer 201 by repeating, at least twice, the stacked structure having the first nitride semiconductor layer and the second nitride semiconductor layer stacked in this order, and that a GaN layer doped with Si to a concentration of $1\times10^{19}/cm^3$ is used as the first nitride semiconductor layer. In that case, a GaN layer having the thickness of about 0.1 μm doped with Si to a concentration of $1\times10^{18}/cm^3$, for example, may be formed as n-type nitride semiconductor layer 201.

Figure 3:
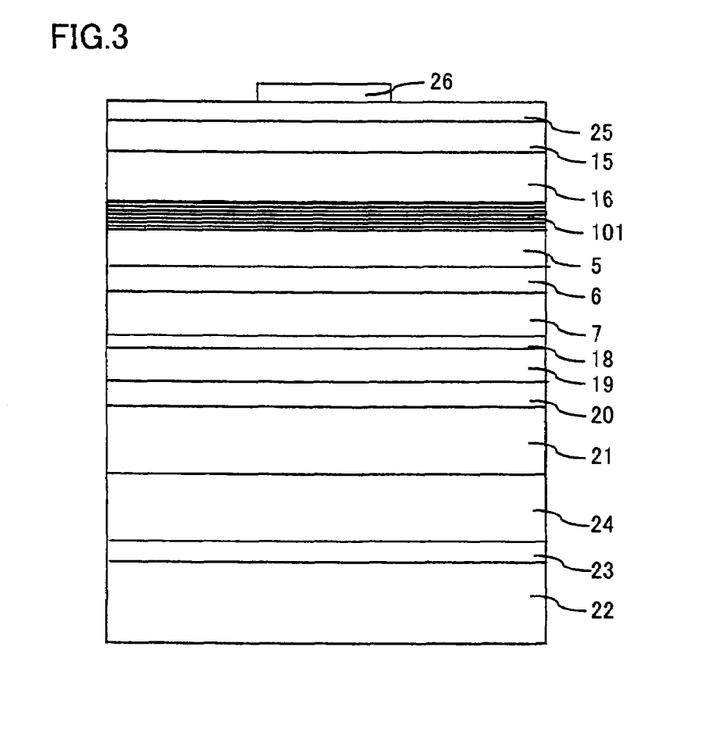

In the following, an exemplary structure of the nitride semiconductor light emitting device in accordance with the present invention where a conductive substrate is used as the supporting substrate will be described with reference to FIG.

3. In the structure shown in FIG. 3, on a conductive substrate 22, a first ohmic electrode 23, a first metal layer 24 for adhesion, a second metal layer 21 for adhesion, a protective layer 20, a reflective layer 19, a second ohmic electrode 18, p-type contact layer 7, p-type clad layer 6, active layer 5, multi-layered nitride semiconductor layer 101, an n-type nitride semiconductor layer 16, an n-type contact layer 15, a transparent conductor electrode 25 and a bonding pad electrode 26 are formed in this order. The p-type contact layer 7 and p-type clad layer 6 form the p-type nitride semiconductor of the present invention, and the multi-layered nitride semiconductor layer 101 and n-type contact layer 15 form the n-type nitride semiconductor of the present invention.

A method of forming the nitride semiconductor light emitting device having such a structure as shown in FIG. 3 will be described in the following. The steps except for the steps of forming the n-type nitride semiconductor and the electrodes are the same as the method described with reference to FIGS. 1 and 2 above, and therefore, description thereof will not be repeated. In the following, the method of forming the n-type nitride semiconductor and the electrodes will be described.

<N-Type Nitride Semiconductor>
(N-Type Contact Layer 15)

On a sapphire substrate (not shown) having a buffer layer formed on a surface thereof, n-type contact layer 15 of GaN doped with Si to a concentration of $5 \times 10^{18}/cm^3$ is grown to the thickness of about 0.2 μm, using hydrogen as the carrier gas, ammonia and TMG as the raw material gases and silane as the impurity gas, with the growth temperature set within a range of 1000 to 1100° C., typically at 1050° C.

(N-Type Nitride Semiconductor Layer 16)

Next, using hydrogen as the carrier gas, ammonia and TMG as the raw material gases and silane as the impurity gas, with the growth temperature set within a range of 1000 to 1100° C., typically at 1050° C., a GaN layer doped with Si to a concentration of $1 \times 10^{18}/cm^3$ is grown to the thickness of about 6 μm, as the n-type nitride semiconductor layer 16. Thereafter, multi-layered nitride semiconductor layer 101 is grown.

FIG. 3 shows an example in which n-type nitride semiconductor layer 16 is formed between n-type contact layer 15 and multi-layered nitride semiconductor layer 101. Provision of the n-type nitride semiconductor layer 16 is advantageous in improvement of crystallinity, though multi-layered nitride semiconductor layer 101 may be grown directly on n-type contact layer 15.

(Multi-Layered Nitride Semiconductor Layer 101)

Next, using hydrogen as the carrier gas, ammonia and TMG as the raw material gases and silane as the impurity gas, with the growth temperature set within a range of 1000 to 100° C., typically at 1050° C., an undoped GaN layer having the thickness of 20 nm as the second nitride semiconductor layer and a GaN layer doped with Si to a concentration of $1 \times 10^{19}/cm^3$ having the thickness of 20 nm as the first nitride semiconductor layer are formed, and by growing the stacked structure consisting of the second and first nitride semiconductor layers by 5 periods (repeating 5 times), the n-type multi-layered nitride semiconductor layer 101 is formed. Thereafter, on multi-layered nitride semiconductor layer 101, active layer 5, p-type clad layer 6 and p-type contact layer 7 are grown. In the method described above, when the growth temperature is set in the range of 500 to 1000° C. and a gas containing nitrogen is used as the carrier gas, the effect of decreasing Vf can satisfactorily be attained.

<Electrode Formation>

The wafer obtained by forming the buffer layer, n-type contact layer 15, n-type nitride semiconductor layer 16, multi-layered nitride semiconductor layer 101, active layer 5, p-type clad layer 6 and p-type contact layer 7 on the substrate through the above-described method is annealed, and on p-type contact layer 7, second ohmic electrode layer 18, reflective layer 19, protective layer 20 and the second metal layer 21 for adhesion are formed successively by EB evaporation (Electron Beam evaporation) method. Here, a Pd layer having the thickness of 3 nm, for example, may be formed as the second ohmic electrode 18, an Ag layer having the thickness of 150 nm, for example, may be formed as reflective layer 19, an Mo layer having the thickness of 50 nm, for example, may be formed as protective layer 20, and an Au layer having the thickness of 3 μm, for example, may be formed as the second metal layer 21 for adhesion.

Then, on a conductive substrate 22 as a supporting substrate prepared separately, the first ohmic electrode 23 and the first metal layer 24 for adhesion are formed in this order by EB evaporation. Here, by way of example, an Si substrate having the thickness of 120 μm may be formed as conductive substrate 22, a Ti/Al combination layer having Ti of 15 nm in thickness and Al of 150 nm in thickness formed in this order may be formed as the first ohmic electrode 23, and an Au/AuSn combination layer having Au of 100 nm in thickness and AuSn of 3 μm in thickness formed in this order may be formed as the first metal layer 24 for adhesion.

Next, the second metal layer 21 for adhesion is formed to join the second metal layer 21 for adhesion and the first metal layer 24 for adhesion. As the second metal layer 21 for adhesion, by way of example, an Au layer having the thickness of 100 nm may be formed. Typically, the Au layer of the Au/AuSn combination layer forming the first metal layer 24 for adhesion is positioned opposite to the Au layer forming the second metal layer 21 for adhesion, and by eutectic bonding, the first metal layer 24 for adhesion and the second metal layer 21 for adhesion are joined. The bonding temperature is set, for example, in the range of 250 to 350° C.

Next, the sapphire substrate and the buffer layer (not shown) are removed. Specifically, by laser irradiation using YAG (yttrium aluminum garnet)-THG (third harmonic generation) laser having the wavelength of 355 nm and directed from the side of sapphire substrate with its rear surface mirror-finished, an interface portion between the buffer layer (not shown) formed on the sapphire substrate and n-type contact layer 15 is thermally decomposed, so that the sapphire substrate and the buffer layer are removed.

On n-type contact layer 15 exposed by the method described above, an ITO (Indium Tin Oxide) layer is formed as transparent conductor electrode 25. Typically, an Sn-doped $In_2O_3$ layer is formed as transparent conductor electrode 25 almost entirely on the surface of n-type contact layer 15, and at a central portion of transparent conductor electrode 25, an n-type bonding pad electrode is formed as bonding pad electrode 26. As bonding pad electrode 26, an Au/Ti combination layer, for example, may be formed.

EXAMPLES

In the following, the present invention will be described in grater detail with reference to specific examples, though the present invention is not limited thereto.

Example 1

In the present example, a nitride semiconductor light emitting device having the structure shown in FIG. 2 was formed.
(Buffer Layer 2)

First, a substrate 1 of sapphire (C plane) was set in a reaction furnace of an MOCVD apparatus, hydrogen was caused to flow while the growth temperature was increased to 1050° C., so that the substrate was cleaned. Next, the growth temperature was decreased to 510° C., and using hydrogen as the carrier gas and ammonia and TMG (trimethyl gallium) as the raw material gases, a buffer layer 2 of GaN was grown to the thickness of about 200 A, on substrate 1.

(Underlying n-Type GaN Layer 3)

Then, the growth temperature was increased to 1050° C., and using hydrogen as the carrier gas, ammonia and TMG as the raw material gases and silane as the impurity gas, underlying n-type GaN layer 3 of GaN doped with Si to a concentration of $1\times10^{18}/cm^3$ was grown to the thickness of 6 μm.

(N-Type Contact Layer 4)

Next, under the same conditions as for underlying n-type GaN layer 3, n-type contact layer 4 of GaN doped with Si to a concentration of $5\times10^{18}/cm^3$ was grown to the thickness of 0.5 μm.

(N-Type Nitride Semiconductor Layer 201)

After the growth of n-type contact layer 4, at the growth temperature of 1050° C., using hydrogen as the carrier gas, ammonia and TMG as the raw material gases and silane as the impurity gas, a GaN layer doped with Si to a concentration of $1\times10^{18}/cm^3$ was grown to the thickness of 0.1 μm, to be n-type nitride semiconductor layer 201.

(Multi-Layered Nitride Semiconductor Layer 101)

Then, at the growth temperature of 1050° C., using hydrogen as the carrier gas, ammonia and TMG as the raw material gases and silane as the impurity gas, an undoped GaN layer having the thickness of 20 nm as the second nitride semiconductor layer and a GaN layer having the thickness of 20 nm and doped with Si to a concentration of $1\times10^{19}/cm^3$ as the first nitride semiconductor layer were formed in this order, and these layers were grown alternately for 5 periods, to provide n-type multi-layered nitride semiconductor layer 101.

(Active Layer 5)

Then, using nitrogen as the carrier gas and ammonia, TMG and TMI as raw material gases with the growth temperature lowered to 700° C., $In_{0.25}Ga_{0.75}N$ and GaN having the thickness of 2.5 nm and 18 nm, respectively, were grown alternately for 6 periods, to form active layer 5 having the multi-quantum well structure, on multi-layered nitride semiconductor layer 101.

(P-Type Clad Layer 6)

Then, using hydrogen as the carrier gas, ammonia, TMA and TMG raw material gases, and CP2Mg (cyclopentadienyl magnesium) as the impurity gas with the growth temperature increased to 950° C., p-type clad layer 6 of $Al_{0.15}Ga_{0.85}N$ doped with Mg to a concentration of $5\times10^{19}/cm^3$ was grown to the thickness of about 30 nm.

(P-Type Contact Layer 7)

Next, using hydrogen as the carrier gas, ammonia and TMG as raw material gases, and CP2Mg as the impurity gas with the growth temperature kept at 950° C., p-type contact layer 7 of GaN doped with Mg to a concentration of $1\times10^{20}/cm^3$ was grown to the thickness of 0.1 μm.

Through the method described above, a wafer having, formed on substrate 1, buffer layer 2, underlying n-type GaN layer 3, n-type contact layer 4, n-type nitride semiconductor layer 201, multi-layered nitride semiconductor layer 101, active layer 5, p-type clad layer 6 and p-type contact layer 7 in this order, was obtained.

(Annealing)

Next, the wafer obtained as above was annealed, using nitrogen as the carrier gas with the growth temperature lowered to 700° C.

(Electrode Formation)

The annealed wafer was taken out from the reaction furnace, a mask patterned to a prescribed shape was formed on a surface of the uppermost layer, that is, p-type contact layer 7, and etching was done from the side of p-type contact layer 7 by an RIE (Reactive Ion Etching) apparatus, so that the surface of n-type contact layer 4 was exposed. After etching, almost on the entire surface of the uppermost, p-type contact layer 7, transparent electrode 8 containing Pd was formed to the thickness of 7 nm, and at a prescribed position thereon, p-side pad electrode 10 of Au was formed to the thickness of 0.5 μm. On the surface of n-type contact layer 4 exposed by etching, n-side pad electrode 9 containing Ti and Al was formed. In this manner, the LED as the nitride semiconductor light emitting device in accordance with the present invention was obtained.

The resulting LED exhibited emission wavelength of 460 nm, emission output of 5 mW and forward voltage Vf of 4.0V, when operated with forward current of 20 mA.

Comparative Example 1

In the present comparative example, a nitride semiconductor light emitting device having the structure shown in FIG. 4 was formed. Specifically, an LED as the nitride semiconductor light emitting device was formed through the same method as Example 1 except that n-type nitride semiconductor layer 201 and multi-layered nitride semiconductor layer 101 were not formed between n-type contact layer 4 and active layer 5.

The resulting LED exhibited emission wavelength of 460 nm, emission output of 4 mW and forward voltage Vf of 4.0V, when operated with forward current of 20 mA.

From the results of Example 1 and Comparative Example 1, it can be seen that light emission output was improved in Example 1 than Comparative Example 1, and therefore, the effect of improving light emission output of the present invention was confirmed.

Comparative Example 2

Figure 5:
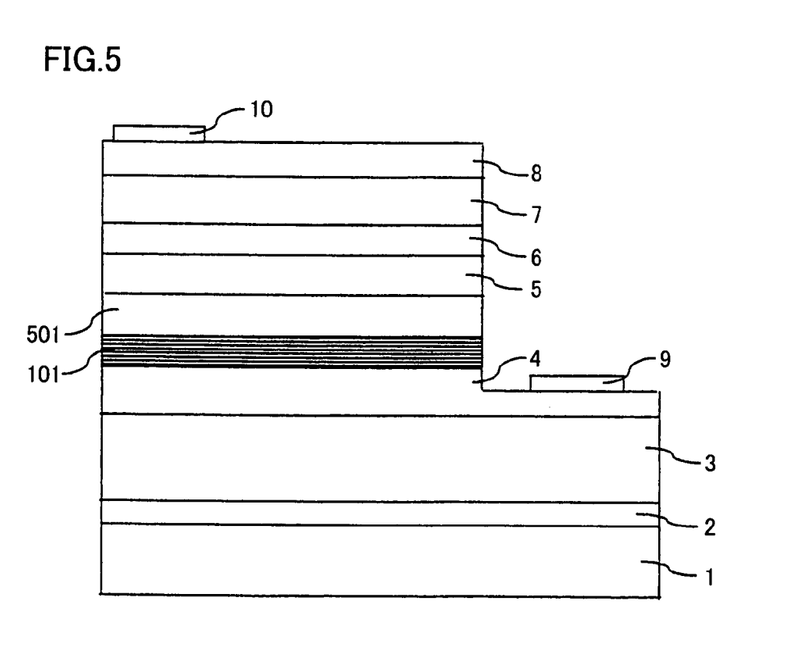
FIG. 5 shows a structure of a nitride semiconductor light emitting device formed as Comparative Example 2.

In the present comparative example, a nitride semiconductor light emitting device having the structure shown in FIG. 5 was formed. Specifically, a nitride semiconductor light emitting device was formed through the same method as Comparative Example 1 except that multi-layered nitride semiconductor layer 101 and an n-side direct underlying layer 501 were stacked between n-type contact layer 4 and active layer 5.

(Multi-Layered Nitride Semiconductor Layer 101)

By the similar method as in Comparative Example 1, buffer layer 2, underlying GaN layer 3 and n-type contact layer 4 were grown on substrate 1. Thereafter, at the growth temperature of 1050° C., using hydrogen as the carrier gas, ammonia and TMG as the raw material gases and silane as the impurity gas, an undoped GaN layer having the thickness of 20 nm as the second nitride semiconductor layer and a GaN layer having the thickness of 20 nm and doped with Si to a concentration of $1\times10^{19}/cm^3$ as the first nitride semiconductor layer were formed in this order, and these layers were grown alternately for 5 periods, to provide n-type multi-layered nitride semiconductor layer 101.

(N-Type Direct Underlying Layer 501)

Then, n-type direct underlying layer 501 was formed on multi-layered nitride semiconductor layer 101. At the growth temperature of 1050° C., using hydrogen as the carrier gas, ammonia and TMG as the raw material gases and silane as the impurity gas, a GaN layer doped with Si to a concentration of $1\times10^{18}/cm^3$ was grown to the thickness of 0.1 μm, as the n-side direct underlying layer 501. Thereafter, by the similar method as in Comparative Example 1, active layer 5, p-type clad layer 6, p-type contact layer 7, transparent electrode 8, n-side pad electrode 9 and p-side pad electrode 10 were grown.

The resulting LED exhibited emission wavelength of 460 nm, emission output of 4 mW and forward voltage Vf of 4.0V, when operated with forward current of 20 mA, that is, the same device properties as those of Comparative Example 1. It was understood that when multi-layered nitride semiconductor layer 101 of the present invention was formed not in contact with the active layer, the effect of improving light emission output could not be attained.

Example 2

In the present example, a nitride semiconductor light emitting device having the structure shown in FIG. 1 was formed. Specifically, an LED as the nitride semiconductor light emitting device of the present invention was formed through the same method as Example 1 except that n-type nitride semiconductor layer 201 of FIG. 2 was not formed.

The resulting LED exhibited emission wavelength of 460 nm, emission output of 4.7 mW and forward voltage Vf of 4.0V, when operated with forward current of 20 mA. Though light emission output was lower than that of Example 1, the light emission output was improved than Comparative Example 1, and it can be seen that the effect of improving light emission output of the present invention was sufficiently attained.

Example 3

In the present example, a nitride semiconductor light emitting device having the structure shown in FIG. 2 was formed. Specifically, an LED as the nitride semiconductor light emitting device of the present invention was formed through the same method as Example 1 except that a GaN layer having the thickness of 20 nm and doped with Si to a concentration of $1\times10^{18}/cm^3$ was formed in place of the undoped GaN layer, as the second nitride semiconductor layer of multi-layered nitride semiconductor layer 101.

The resulting LED exhibited emission wavelength of 460 nm, emission output of 5 mW and forward voltage Vf of 4.0V, when operated with forward current of 20 mA, that is, the same properties as attained by Example 1.

Example 4

In the present example, a nitride semiconductor light emitting device having the structure shown in FIG. 2 was formed. Specifically, an LED as the nitride semiconductor light emitting device of the present invention was formed through the same method as Example 1 except that a GaN layer having the thickness of 20 nm and doped with Si to a concentration of $3\times10^{18}/cm^3$ was formed in place of the undoped GaN layer, as the second nitride semiconductor layer of multi-layered nitride semiconductor layer 101.

The resulting LED exhibited emission wavelength of 460 nm, emission output of 4.2 mW and forward voltage Vf of 4.0V, when operated with forward current of 20 mA. Though light emission output was improved than Comparative Example 1, it was lower than that of Example 1.

Example 5

In the present example, a nitride semiconductor light emitting device having the structure shown in FIG. 2 was formed. Specifically, an LED as the nitride semiconductor light emitting device of the present invention was formed through the same method as Example 1 except that repetition period of multi-layered nitride semiconductor layer 101 was changed from 5 to 2.

The resulting LED exhibited emission wavelength of 460 nm, emission output of 4.5 mW and forward voltage Vf of 4.0V, when operated with forward current of 20 mA. Though light emission output was slightly lower than that of Example 1, the light emission output was better than Comparative Example 1.

Comparative Example 3

In the present comparative example, a nitride semiconductor light emitting device having the structure shown in FIG. 2 was formed. Specifically, an LED as the nitride semiconductor light emitting device was formed through the same method as Example 1 except that repetition period of multi-layered nitride semiconductor layer 101 was changed from 5 to 1.

The resulting LED exhibited emission wavelength of 460 nm, emission output of 4.0 mW and forward voltage Vf of 4.0V, when operated with forward current of 20 mA, that is, the same properties as attained by Comparative Example 1.

Example 6

In the present example, a nitride semiconductor light emitting device having the structure shown in FIG. 2 was formed. Specifically, an LED as the nitride semiconductor light emitting device of the present invention was formed through the same method as Example 1 except that thickness of the first and second nitride semiconductor layers of multi-layered nitride semiconductor layer 101 was changed from 20 nm to 100 nm.

The resulting LED exhibited emission wavelength of 460 nm, emission output of 4.5 mW and forward voltage Vf of 4.0V, when operated with forward current of 20 mA. Though light emission output was slightly lower than that of Example 1, the light emission output was better than Comparative Example 1.

Example 7

In the present example, a nitride semiconductor light emitting device having the structure shown in FIG. 2 was formed. Specifically, an LED as the nitride semiconductor light emitting device of the present invention was formed through the same method as Example 1 except that thickness of the first and second nitride semiconductor layers of multi-layered nitride semiconductor layer 101 was changed from 20 nm to 5 nm.

The resulting LED exhibited emission wavelength of 460 nm, emission output of 5 mW and forward voltage Vf of 4.0V, when operated with forward current of 20 mA, that is, the same properties as attained by Example 1.

Example 8

In the present example, a nitride semiconductor light emitting device having the structure shown in FIG. 2 was formed.

Specifically, an LED as the nitride semiconductor light emitting device of the present invention was formed through the same method as Example 1 except that the method of forming multi-layered nitride semiconductor layer 101 was changed as follows. Specifically, after the growth of n-type nitride semiconductor layer 201, the growth temperature was decreased to 850° C., and using nitrogen as the carrier gas, ammonia and TMG as the raw material gases and silane as the impurity gas, an undoped GaN layer having the thickness of 20 nm as the second nitride semiconductor layer and a GaN layer having the thickness of 20 nm and doped with Si to a concentration of $1\times10^{19}/cm^3$ as the first nitride semiconductor layer were formed in this order, and these layers were grown alternately for 5 periods, to provide n-type multi-layered nitride semiconductor layer 101.

The resulting LED exhibited emission wavelength of 460 nm, emission output of 5 mW and forward voltage Vf of 3.5V, when operated with forward current of 20 mA, and Vf was further decreased from Example 1.

Example 9

In the present example, a nitride semiconductor light emitting device having the structure shown in FIG. 2 was formed. Specifically, an LED as the nitride semiconductor light emitting device of the present invention was formed through the same method as Example 8 except that the growth temperature of multi-layered nitride semiconductor layer 101 was set to 500° C.

The resulting LED exhibited emission wavelength of 460 nm, emission output of 4.5 mW and forward voltage Vf of 3.8V, when operated with forward current of 20 mA. Though Vf was slightly inferior to that of Example 8 and light emission output was slightly lower than that of Example 1, the light emission output was improved and Vf was made lower than Comparative Example 1. Thus, it can be seen that the effect of improving light emission output and decreasing Vf of the present invention was sufficiently attained, and satisfactory device characteristics were attained. As to Vf, the effect of decreasing was even better than in Example 1.

Example 10

In the present example, a nitride semiconductor light emitting device having the structure shown in FIG. 2 was formed. Specifically, an LED as the nitride semiconductor light emitting device of the present invention was formed through the same method as Example 8 except that the growth temperature of multi-layered nitride semiconductor layer 101 was set to 1000° C.

The resulting LED exhibited emission wavelength of 460 nm, emission output of 5 mW and forward voltage Vf of 3.8V, when operated with forward current of 20 mA. The light emission output was improved and Vf was made lower than Comparative Example 1, and it can be seen that the effect of improving light emission output and decreasing Vf of the present invention was sufficiently attained, and satisfactory device characteristics were attained. As to Vf, the effect of decreasing was better than in Example 1, though not as high as Example 8.

Example 11

In the present example, a nitride semiconductor light emitting device having the structure shown in FIG. 2 was formed. Specifically, an LED as the nitride semiconductor light emitting device of the present invention was formed through the same method as Example 1 except that a mixed gas of hydrogen and nitrogen with the flow ratio of hydrogen:nitrogen=1:1 was used as the carrier gas.

The resulting LED exhibited emission wavelength of 460 nm, emission output of 5 mW and forward voltage Vf of 3.8V, when operated with forward current of 20 mA. The light emission output was improved and Vf was made lower than Comparative Example 1, and it can be seen that the effect of improving light emission output and decreasing Vf of the present invention was sufficiently attained, and satisfactory device characteristics were attained. As to Vf, the effect of decreasing was better than in Example 1, though not as high as Example 8.

Example 12

In the present example, a nitride semiconductor light emitting device having the structure shown in FIG. 3 was formed. The steps except for the steps of forming the n-type nitride semiconductor and the electrodes were the same as those of Example 1, and therefore, description thereof will not be repeated. In the following, the method of forming the n-type nitride semiconductor and the electrodes of the present example will be described.

(N-Type Contact Layer 15)

On a sapphire substrate, a buffer layer was formed, and thereafter, using hydrogen as the carrier gas, ammonia and TMG as the raw material gases and silane as the impurity gas, with the growth temperature increased to 1050° C., n-type contact layer 15 of GaN doped with Si to a concentration of $5\times10^{18}/cm^3$ was grown to the thickness of 0.2 μm.

(N-Type Nitride Semiconductor Layer 16)

Then, using hydrogen as the carrier gas, ammonia and TMG as the raw material gases and silane as the impurity gas, with the growth temperature set at 1050° C., a GaN layer doped with Si to a concentration of $1\times10^{18}/cm^3$ was grown to the thickness of 6 μm, as the n-type nitride semiconductor layer 16. Thereafter, multi-layered nitride semiconductor layer 101 was grown.

(Multi-Layered Nitride Semiconductor Layer 101)

After the growth of n-type nitride semiconductor layer 16, at the growth temperature of 1050° C., using hydrogen as the carrier gas, ammonia and TMG as the raw material gases and silane as the impurity gas, an undoped GaN layer having the thickness of 20 nm as the second nitride semiconductor layer and a GaN layer having the thickness of 20 nm and doped with Si to a concentration of $1\times10^{19}/cm^3$ as the first nitride semiconductor layer were formed in this order, and these layers were grown alternately for 5 periods, to provide n-type multi-layered nitride semiconductor layer 101. Thereafter, active layer 5, p-type clad layer 6 and p-type contact layer 7 were grown in the similar manner as in Example 1.

(Electrode Formation)

The wafer obtained by forming the buffer layer 2, n-type contact layer 15, n-type nitride semiconductor layer 16, multi-layered nitride semiconductor layer 101, active layer 5, p-type clad layer 6 and p-type contact layer 7 in this order on substrate 1 through the above-described method was annealed in the similar manner as in Example 1.

After annealing, on p-type contact layer 7, second ohmic electrode layer 18, reflective layer 19, protective layer 20 and the second metal layer 21 for adhesion were formed successively by EB evaporation (Electron Beam evaporation) method. Here, a Pd layer having the thickness of 3 nm was formed as the second ohmic electrode 18, an Ag layer having the thickness of 150 nm was formed as reflective layer 19, an Mo layer having the thickness of 50 nm was formed as protective layer 20, and an Au layer having the thickness of 3 μm was formed as the second metal layer 21 for adhesion.

Then, on a conductive substrate 22 as a supporting substrate prepared separately, the first ohmic electrode 23 and the first metal layer 24 for adhesion were formed in this order by EB evaporation. Here, an Si substrate having the thickness of 120 μm was formed as conductive substrate 22, a Ti/Al combination layer having Ti of 15 nm in thickness and Al of 150 nm in thickness formed in this order was formed as the first ohmic electrode 23, and an Au/AuSn combination layer having Au of 100 nm in thickness and AuSn of 3 μm in thickness formed in this order was formed as the first metal layer 24 for adhesion.

Next, the second metal layer 21 for adhesion was joined to the first metal layer 24 for adhesion. Specifically, the Au layer of the Au/AuSn combination layer forming the first metal layer 24 for adhesion was positioned opposite to the Au layer forming the second metal layer 21 for adhesion, and by eutectic bonding, the layers were joined. The bonding temperature was set to 290° C. Next, the sapphire substrate and the buffer layer (not shown) were removed. Specifically, by laser irradiation using YAG (yttrium aluminum garnet)-THG (third harmonic generation) laser (wavelength: 355 nm) directed from the side of sapphire substrate with its rear surface mirror-finished, an interface portion between the buffer layer formed on the sapphire substrate and n-type contact layer 15 was thermally decomposed, for removal.

Next, on n-type contact layer 15 exposed by the removal of the substrate and the buffer layer, an Sn-doped $In_2O_3$ layer was formed as transparent conductor electrode 25 almost entirely on the surface, and at a central portion of transparent conductor electrode 25, an n-type bonding pad electrode of Au/Ti combination layer was formed as bonding pad electrode 26. Through the method described above, the LED as the nitride semiconductor light emitting device of the present invention was formed.

The resulting LED exhibited emission wavelength of 460 nm, emission output of 10 mW and forward voltage Vf of 3.7V, when operated with forward current of 20 mA. The light emission output was higher than Comparative Example 4, and in this structure also, the effect of improving light emission output of the present invention could be confirmed.

Comparative Example 4

Figure 6:
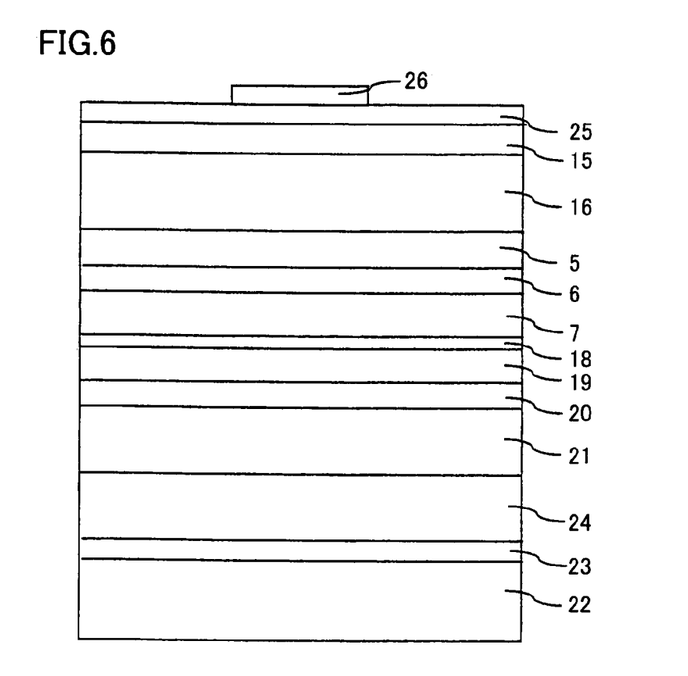
FIG. 6 shows a structure of a nitride semiconductor light emitting device formed as Comparative Example 4.

In the present comparative example, a nitride semiconductor light emitting device having the structure shown in FIG. 6 was formed. Specifically, an LED as the nitride semiconductor light emitting device was formed through the same method as Example 12 except that n-type nitride semiconductor layer 16 and multi-layered nitride semiconductor layer 101 of FIG. 3 were not formed.

The resulting LED exhibited emission wavelength of 460 nm, emission output of 8 mW and forward voltage Vf of 3.7V, when operated with forward current of 20 mA, and light emission output was lower than Example 12.

From these results, the effect of improving light emission output of the present invention attained by forming the multi-layered nitride semiconductor layer in contact with the active layer was confirmed. Further, it was confirmed that the effect of lowering Vf could also be attained when the growth temperature was set in the range of 500 to 1000° C. and a gas containing nitrogen was used as the carrier gas.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a nitride semiconductor light emitting device comprising:
   growing an n-type nitride semiconductor layer including a multi-layered nitride semiconductor stacked structure by organic metal vapor deposition in a carrier gas containing nitrogen at a growth temperature of 500 to 1000° C., the multi-layered nitride semiconductor stacked structure comprising at least two layers each including a first nitride semiconductor layer and a second nitride semiconductor layer, wherein said first nitride semiconductor layer comprises n-type impurity and said second nitride semiconductor layer comprises undoped material or n-type impurity at a concentration lower than the n-type impurity of the first nitride semiconductor layer;
   forming an active layer over the n-type nitride semiconductor layer; and
   stacking a p-type nitride semiconductor layer over the active layer
   wherein a thickness of each of said first nitride semiconductor layer and said second nitride semiconductor layer is from 5 to 20 nm.

2. A method according to claim 1, wherein said n-type nitride semiconductor layer comprises a plurality of GaN layers.

3. A method according to claim 1, wherein the n-type impurity concentration of said first nitride semiconductor layer is higher than $1\times10^{18}/cm^3$; and the n-type impurity concentration of said second nitride semiconductor layer is no higher than $1\times10^{18}/cm^3$.

4. A method according to claim 3, wherein said n-type nitride semiconductor layer comprises a plurality of GaN layers.

5. A method according to claim 1, wherein said n-type nitride semiconductor layer comprises a plurality of GaN layers.

6. A method according to claim 1, wherein the n-type impurity concentration of said first nitride semiconductor layer is higher than $1\times10^{18}/cm^3$; and the n-type impurity concentration of said second nitride semiconductor layer is no higher than $1\times10^{18}/cm^3$.

7. A method of manufacturing the nitride semiconductor light emitting device according to claim 6, wherein said n-type nitride semiconductor layer comprises a plurality of GaN layers.

* * * * *